(12) United States Patent
Nakatani

(10) Patent No.: US 7,928,519 B2
(45) Date of Patent: Apr. 19, 2011

(54) METHOD FOR MANUFACTURING CAPACITIVE SENSOR, AND CAPACITIVE SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/907,330

(22) Filed: Oct. 11, 2007

(65) Prior Publication Data
US 2008/0087971 A1   Apr. 17, 2008

(30) Foreign Application Priority Data
Oct. 12, 2006   (JP) .................................. 2006-278788

(51) Int. Cl.
*H01L 29/78* (2006.01)
(52) U.S. Cl. ...................... 257/413; 438/381; 257/416
(58) Field of Classification Search .................. 257/416; 438/381
See application file for complete search history.

(56) References Cited

U.S. PATENT DOCUMENTS

| 6,731,766 | B2 * | 5/2004 | Yasuno et al. | 381/171 |
| 7,301,213 | B2 * | 11/2007 | Matsubara et al. | 257/416 |
| 2007/0058825 | A1 * | 3/2007 | Suzuki et al. | 381/174 |
| 2007/0071261 | A1 * | 3/2007 | Matsuzawa | 381/191 |
| 2007/0236310 | A1 * | 10/2007 | Fazzio et al. | 333/187 |

* cited by examiner

*Primary Examiner* — Steven Loke
*Assistant Examiner* — Kimberly M Thomas
(74) *Attorney, Agent, or Firm* — Rabin & Berdo, PC

(57) ABSTRACT

In the method for manufacturing a capacitance sensor according to the present invention, after a protection layer is pattern-formed on the surface of a silicon substrate, a first metal layer is formed on the surface of a silicon substrate so as to be opposed to a protection layer non-formed area on which no protection layer is formed and to expose a part of the protection layer non-formed area. After that, a first insulation layer, a metal sacrificing layer, and a second insulation layer, and a second metal layer are formed on the first metal layer in this order. Then, the metal sacrificing layer is removed by supplying a metal etching solution on the metal sacrificing layer. Further, a part of the silicon substrate is removed by supplying a silicon etching solution to the silicon substrate from the portion, from which the metal sacrificing layer is removed, via the protection layer non-formed area exposed by the removal of the metal sacrificing layer.

14 Claims, 5 Drawing Sheets

METHOD FOR MANUFACTURING CAPACITIVE SENSOR, AND CAPACITIVE SENSOR

BACKGROUND OF THE INVENTION

1. Field of the Invention

The present invention relates to a CAPACITIVE SENSOR such as an Si (Silicon) microphone, etc., and a method for manufacturing the same.

2. Description of Related Art

In recent years, in place of ECM (Electret Condenser Microphone), mobile phones have started to be equipped with Si microphones manufactured by MEMS (Micro Electro Mechanical Systems) technology, therefore Si microphones have been dramatically attracted attention.

For ECMs, it is impossible to fix on a wiring board by soldering. If the ECM is at a high temperature for reflow, electric charge leaks from a macromolecular film that is a thin film to sense sound pressure, so that the ECM will stop functioning as a microphone. Therefore, the ECM is fixed on a wiring board by using an exclusive component. As opposed to this, since an Si microphone can be reflowed at a high temperature that exceeds 250° C., it is possible that the Si microphone is mounted on a wiring board by an automatic mounter as with other semiconductor components. Therefore, it is possible to lower the mounting costs by using an Si microphone.

FIG. 4 is a schematic sectional view showing the structure of a prior art Si microphone.

An Si microphone 101 includes a silicon substrate 102. A through-hole 103 is formed, whose section is trapezoidal and inner diameter is gradually widened toward the rear side thereof at the center of the silicon substrate 102. A thin film 104 formed of polysilicon is disposed on the surface of the silicon substrate 102 so as to block the through-hole 103. Also, a back plate 105 formed of polysilicon is disposed on the thin film 104 so as to be opposed to the thin film 104. A number of holes 106 are formed through the back plate 105. The back plate 105 is supported at the peripheral edge portion thereof by the supporting frame 107, and a cavity 108 having minute spacing is formed between the thin film 104 and the back plate 105. Accordingly, the thin film 104 and the back plate 105 are opposed to each other with the cavity 108 sandwiched therebetween and form a capacitor.

When sound pressure (sound waves) is inputted in the Si microphone 101, the thin film 104 is oscillated by the sound pressure, whereby electric signals corresponding to changes in the electrostatic capacitance of the capacitor, which are generated by oscillation of the thin film 104, are outputted.

However, in a manufacturing process of traditional Si microphones 101, since the thin film 104 is formed on the surface of the silicon substrate 102, it is necessary that an etching solution is supplied onto the silicon substrate 102 from the rear side thereof in order to form the through-hole 103 on the silicon substrate 102. On the other hand, the cavity 108 between the thin film 104 and the back plate 105 is formed by etching a silicon oxide thin film after accumulating silicon oxide on the thin film 104 and forming the back plate 105 on the thin film formed of the silicon oxide. However, for the etching, it is necessary for an etching solution to be supplied through the hole 106 formed on the back plate 105. For this reason, it is impossible that a step for forming the through-hole 103 and a step for forming the cavity 108 are carried out in the same process.

SUMMARY OF THE INVENTION

It is therefore an object of the present invention to provide a method for manufacturing a capacitance sensor and a capacitance sensor, which are capable of etching a silicon substrate from the surface side.

A method for manufacturing a capacitance sensor according to an aspect of the present invention includes the steps of: forming a protection layer, which has resistance against a silicon etching solution capable of etching silicon, on a surface of a silicon substrate by patterning; forming a first metal layer on a surface of the silicon substrate after the protection layer forming step so as to be opposed to a protection layer non-formed area on which the protective layer is not formed and to expose a part of the protection layer non-formed area; forming a first insulation layer having resistance against a metal etching solution capable of etching a specific metal, at least on the first metal layer; forming a metal sacrificing layer formed of the specific metal on the protection layer non-formed area which is exposed from the first metal layer, and on the first insulation layer; forming a second insulation layer having resistance against the metal etching solution, on the metal sacrificing layer; forming a second metal layer on the second insulation layer; removing the metal sacrificing layer by supplying the metal etching solution to the metal sacrificing layer; and etching the silicon substrate to remove a part of the silicon substrate, by supplying the silicon etching solution to the silicon substrate from a portion from which the metal sacrificing layer is removed, via the protection layer non-formed area exposed by the removal of the metal sacrificing layer.

With the manufacturing method, after a protection layer is pattern-formed on the surface of a silicon substrate, the first metal layer is formed on the surface of a silicon substrate so as to be opposed to a protection layer non-formed area in which no protection layer is formed, and to expose a part of the protection layer non-formed area. After that, the first insulation layer, a metal sacrificing layer, the second insulation layer, and the second metal layer are formed on the first metal layer in this order. Then, the metal sacrificing layer is removed by supplying a metal etching solution to the metal sacrificing layer. Further, since a silicon etching solution is supplied from the portion, from which the metal sacrificing layer is removed, to the silicon substrate via the protection layer non-formed area exposed by the removal of the metal sacrificing layer, a part of the silicon substrate is removed.

Thus, a part of the silicon substrate can be etched (removed) by supplying a metal etching solution and a silicon etching solution from the surface side of the silicon substrate.

By the manufacturing method, a capacitance sensor can be manufactured which includes a silicon substrate having a hole or recess whose section is trapezoidal and whose dimension becomes smaller toward the rear side thereof, a first metal layer provided on the surface of the silicon substrate and opposed to the hole or recess, a first insulation layer formed on the first metal layer, a second metal layer opposed to the first insulation layer with predetermined spacing, and a second metal layer formed on the second insulation layer.

In the capacitance sensor, a cavity between the first insulation layer and the second insulation layer may communicate with the hole or recess.

The silicon etching solution and the metal etching solution may be the same etching solution, and the metal sacrificing layer removing step and the silicon substrate etching step may be carried out in the same process. By using the same etching solution for the silicon etching solution and the metal etching solution, in other words, by using an etching solution capable of etching both the metal which forms the metal sacrificing layer, and silicon, removal of the metal sacrificing layer and etching of the silicon substrate can be carried out in the same process. As a result, it is possible to reduce the number of steps for manufacturing the capacitance sensor.

In addition, the method for manufacturing a capacitance sensor may further include the steps of: forming a polysilicon sacrificing layer formed of polysilicon in the protection layer non-formed area on the surface of the silicon substrate before the step for forming the first metal layer; and removing the polysilicon sacrificing layer through etching by supplying an etching solution to the polysilicon sacrificing layer from the portion from which the metal sacrificing layer, after the metal sacrificing layer removing step and before the silicon substrate etching step. That is, a polysilicon sacrificing layer may be formed on the protection layer non-formed area on the surface of the silicon substrate. In this case, the polysilicon sacrificing layer may be removed by supplying an etching solution capable of etching polysilicon to the polysilicon sacrificing layer after the metal sacrificing layer is removed by supplying a metal etching solution, and further, a part of the silicon substrate may be removed by supplying a silicon etching solution.

It is preferable that the second metal layer is formed of gold. If the second metal layer is a gold layer that is formed by gold, it is possible to favorably connect a bonding wire such as a gold thin wire to the portion by exposing a part of the gold layer. Therefore, it is possible to omit a film to secure a satisfactory connection between the second metal layer and the bonding wire, whereby the structure can be simplified.

The above-described and other objects, features and effects of the present invention can be made apparent based on the following description of embodiments with reference to the accompanying drawings.

DETAILED DESCRIPTION OF PREFERRED EMBODIMENTS

Figure 1:
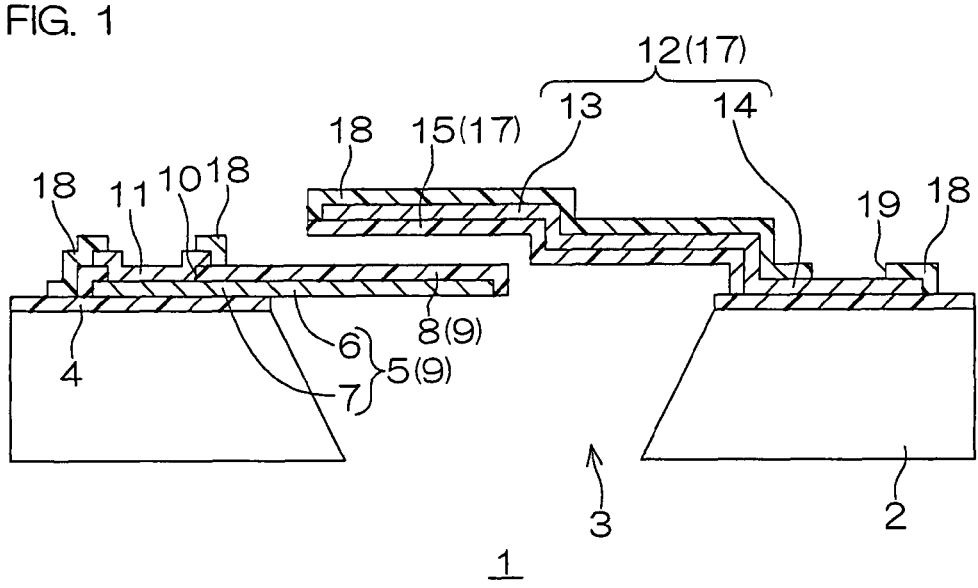
FIG. 1 is a schematic sectional view showing a structure of an Si microphone according to one embodiment of the present invention.

FIG. 1 is a schematic sectional view showing a structure of an Si microphone according to one embodiment of the present invention.

The Si microphone 1 includes a silicon substrate 2. A through-hole 3 whose section is trapezoidal and whose dimension (that is, the width in the direction parallel to the surface of the silicon substrate 2) becomes smaller toward the rear side is formed at the center of the silicon substrate 2.

The surface of the silicon substrate 2 is covered by a protection layer 4 formed of silicon oxide. The protection layer 4 has resistance against a metal etching solution, a polysilicon etching solution and a silicon etching solution which will be described later.

Also, the Si microphone 1 includes a first metal layer 5 made of aluminum. The first metal layer 5 integrally includes an opposing portion 6 rectangular in plan view and opposed to the through-hole 3, and an extension portion 7 that is connected to one end edge of the opposing portion 6 and extends along the surface of the protection layer 4. Also, the surface (upper surface) and the side surfaces of the first metal layer 5 are covered by a first insulation layer 8 consisting of silicon oxide to which p-type impurities are doped. The first metal layer 5 and the first insulation layer 8 form an oscillation film 9 that oscillates when receiving a sound pressure.

An opening 10 that exposes the distal end (the end portion opposite to the opposing portion 6 side) of the extension portion 7 of the first metal layer 5 as a bonding pad is formed in the first insulation layer 8. A metal thin film 11 covering the extension portion 7 (bonding pad) exposed from the opening 10 is formed on the opening 10.

Further, the Si microphone 1 includes a second metal layer 12 made of gold. The second metal layer 12 integrally includes an opposing portion 13 opposed to the oscillation film 9 from above with spacing above the through-hole 3, and an extension portion 14 that is connected to one end edge of the opposing portion 13 and extends along the surface of the protection layer 4. The under surface of the second metal layer 12 is covered by the second insulation layer 15 formed of silicon oxide to which p-type impurities are doped. The second metal layer 12 and the second insulation layer 15 form a back plate 17 that is opposed to the oscillation film 9 via a cavity 16 of minute spacing (for example, 4 μm), and the back plate 17 forms a capacitor whose electrostatic capacitance changes by an oscillation of the oscillation film 9, along with the oscillation film 9. The cavity 16 communicates with the through-hole 3 of the silicon substrate 2 via a space between the oscillation film 9 and a portion extending on the surface of the protection layer 4 of and the back plate 17.

The peripheral portion of the gold film 11 and the surface (upper surface) and the side surfaces of the second metal layer 12 are covered by a surface protection film 18 formed of silicon nitride. An opening 19 that exposes the distal end portion (the end portion opposite to the opposing portion 13 side) of the extension portion 14 of the second metal layer 12 as a bonding pad is formed in the surface protection film 18.

In the Si microphone 1, when sound pressure (sound wave) is inputted, the oscillation film 9 is oscillated by the sound pressure, and electric signals corresponding to changes in the electrostatic capacitance generated by oscillation of the oscillation film 9 are outputted.

FIGS. 2A to 2J are schematic sectional views that describe a manufacturing process of the Si microphone 1.

Figure 2A:
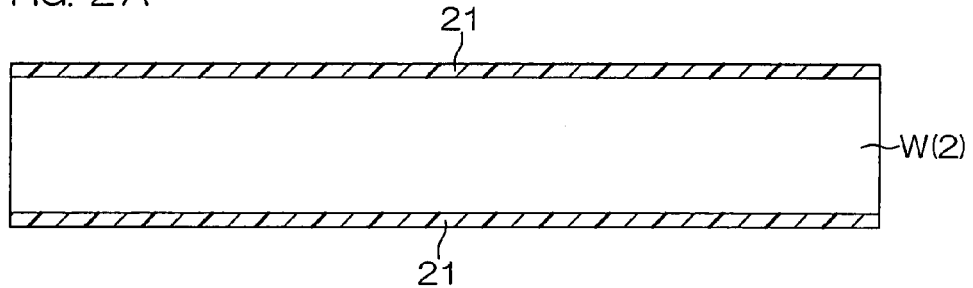
FIG. 2A is a schematic sectional view describing a manufacturing process of the Si microphone.

First, as shown in FIG. 2A, a silicon oxide film 21 is formed on the entire surface of a silicon wafer W, which forms a matrix of the silicon substrate 2, by a thermal oxidation process. In FIGS. 2A to 2J, a part of the silicon wafer W is shown, and the silicon oxidation film 21 formed on the peripheral side surface of the silicon wafer W is not shown.

Figure 2B:
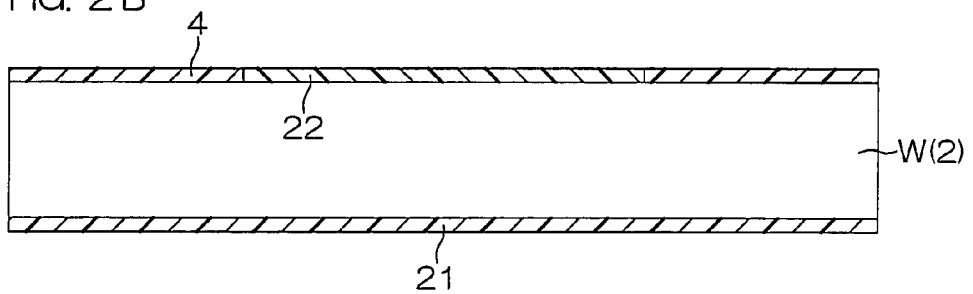
FIG. 2B is a schematic sectional view showing a next step of FIG. 2A.

Next, a resist pattern is formed by a photolithography technology on the silicon oxidation film 21 on the surface of the silicon wafer W. Then, as shown in FIG. 2B, by etching using the resist pattern as a mask, the protection layer 4 having an opening by which a part of the surface of the silicon wafer W (silicon substrate 2) is exposed as the protection layer non-formed area is formed on the surface of the silicon wafer W (protection layer forming step).

In addition, hereinafter, a technology for forming a resist pattern on a layer or a film by a photolithography technology and patterning the layer or the film by etching using the resist pattern as a mask, which is represented by formation of the protection layer 4, is merely called "pattern etching technology."

Subsequently, polysilicon is accumulated on the opening and the protection layer 4. Then, the accumulated layer of polysilicon outside the opening of the protection layer 4 is removed by the pattern etching technology. Thus, as shown in FIG. 2B, a polysilicon sacrificing layer 22 formed of polysilicon is formed in the opening of the protection layer 4 (polysilicon sacrificing layer forming step).

Figure 2C:
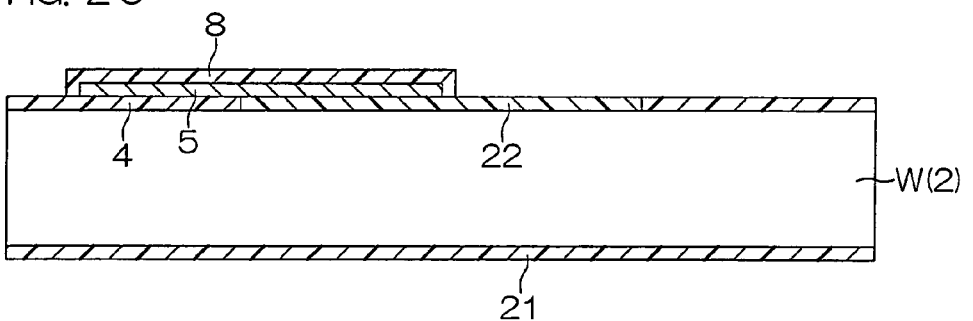
FIG. 2C is a schematic sectional view showing a next step of FIG. 2B.

After that, as shown in FIG. 2C, the first metal layer 5 made of aluminum and the first insulation layer 8 formed of silicon oxide to which p-type impurities are doped are formed by the pattern etching technology (first metal layer forming step and first insulation layer forming step).

Figure 2D:
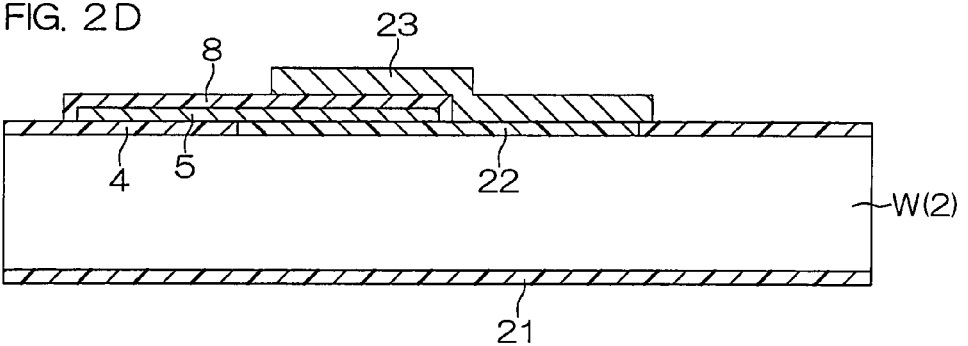
FIG. 2D is a schematic sectional view showing a next step of FIG. 2C.

Next, as shown in FIG. 2D, a metal sacrificing layer 23 made of aluminum is formed across the first insulation layer 8, the polysilicon sacrificing layer 22 and the protection layer 4 by the pattern etching technology (metal sacrificing layer forming step).

Figure 2E:
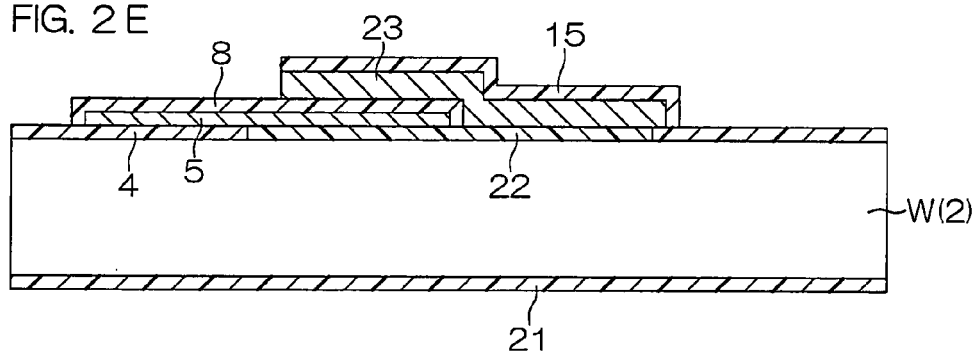
FIG. 2E is a schematic sectional view showing a next step of FIG. 2D.

After that, as shown in FIG. 2E, the second insulation layer 15 made of silicon oxide to which p-type impurities are doped is formed on the metal sacrificing layer 23 (second insulation layer forming step).

Figure 2F:
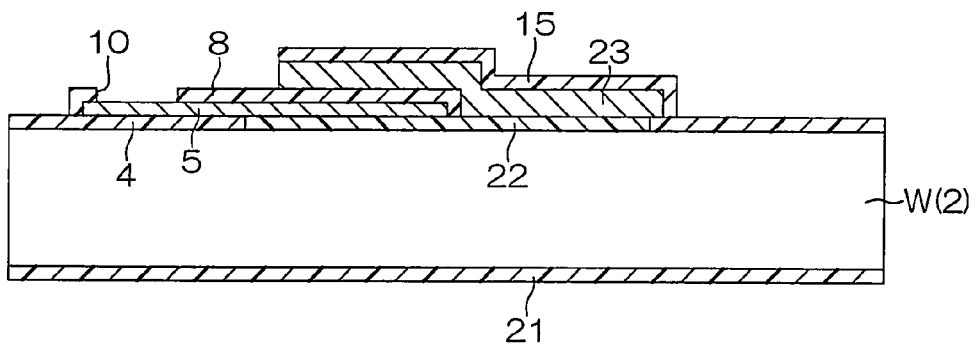
FIG. 2F is a schematic sectional view showing a next step of FIG. 2E.

Subsequently, as shown in FIG. 2F, the opening 10 is formed in the first insulation layer 8 by the pattern etching technology.

Figure 2G:
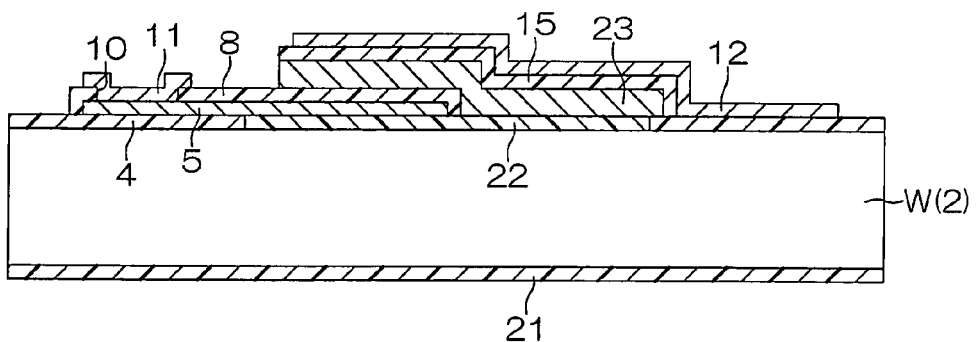
FIG. 2G is a schematic sectional view showing a next step of FIG. 2F.

After that, as shown in FIG. 2G, the metal film 11 is formed on the opening 10. Also, the second metal layer 12 made of gold is formed on the second insulation layer 15 (second metal layer forming step).

Figure 2H:
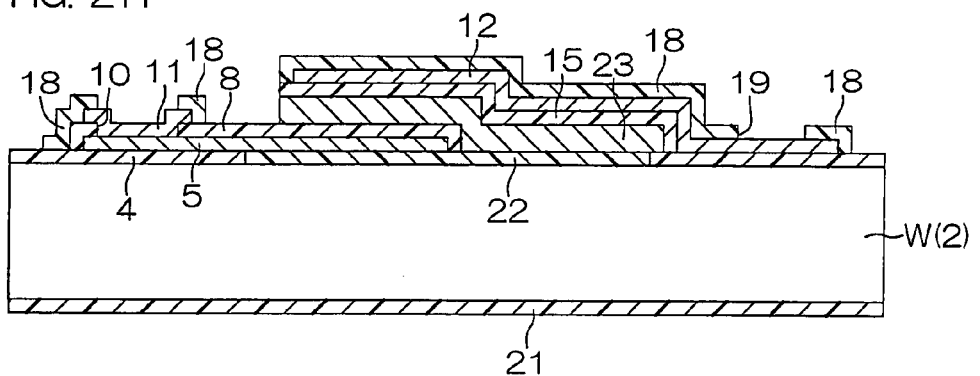
FIG. 2H is a schematic sectional view showing a next step of FIG. 2G.
Figure 2:
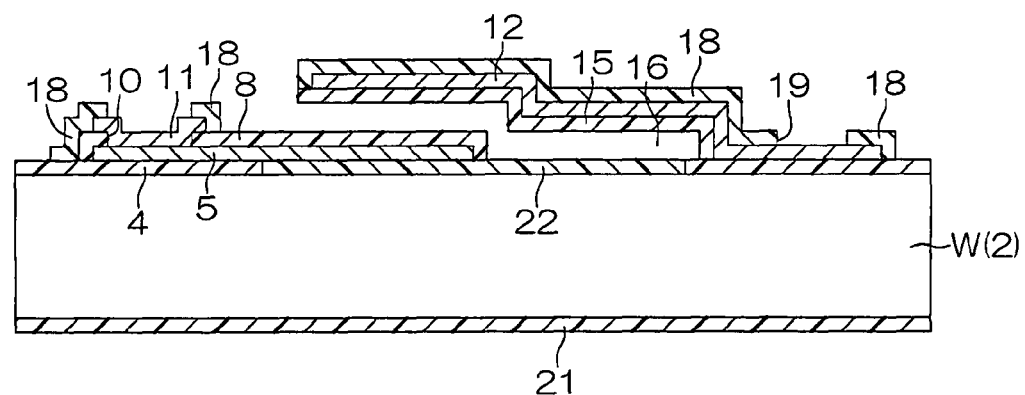
FIG. 2I is a schematic sectional view showing a next step of FIG. 2H.
FIG. 2J is a schematic sectional view showing a next step of FIG. 2I.
Figure 2:
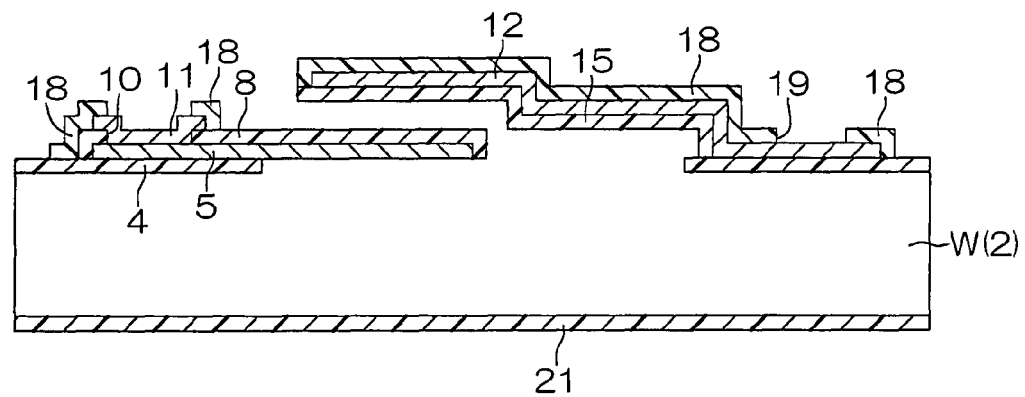

Next, as shown in FIG. 2H, the surface protection film 18 made of silicon nitride is formed by the pattern etching technology.

Thereafter, the metal sacrificing layer 23 made of aluminum is removed by supplying a metal etching solution capable of etching aluminum to the metal sacrificing layer 23 (metal sacrificing layer removing step). Thereby, as shown in FIG. 2I, the cavity 16 is formed between the first insulation layer 8 (oscillation film 9) and the second insulation layer 15 (back plate 17).

Then, the polysilicon sacrificing layer 22 made of polysilicon is removed by supplying a polysilicon etching solution capable of etching polysilicon through the cavity 16 (polysilicon sacrificing layer removing step). Thus, as shown in FIG. 2J, a part of the surface of the silicon wafer W (silicon substrate 2) is exposed through the opening of the protection layer 4 as the protection layer non-formed area.

Thus, after the metal sacrificing layer 23 and the polysilicon sacrificing layer 22 are removed, the silicon oxide film 21 on the rear surface of the silicon wafer W is removed. Also, the silicon wafer W is etched by supplying a silicon etching solution capable of etching silicon through the cavity 16 between the first insulation layer 8 and the second insulation layer 15, and the through-hole 3 whose section is trapezoidal and whose dimension becomes smaller toward the rear side thereof is formed in the silicon wafer W (silicon substrate etching step). Then, the Si microphone 1 having the structure shown in FIG. 1 is obtained by cutting and separating the silicon wafer W.

A silicon etching solution may be supplied to the rear surface of the silicon wafer W while a silicon etching solution is supplied through the cavity 16. Thereby, the thickness of the silicon wafer W may be made thin, wherein it is possible to shorten the time required for etching to form the through-hole 3.

Thus, after the metal sacrificing layer 23 and the polysilicon sacrificing layer 22 are removed by supplying a metal etching solution and a polysilicon etching solution from the surface of the silicon substrate 2 (silicon wafer W), a part of the silicon substrate 2 is etched by supplying a silicon etching solution through the cavity 16 thus produced, thereby forming the through-hole 3 in the silicon substrate 2.

Figure 3:
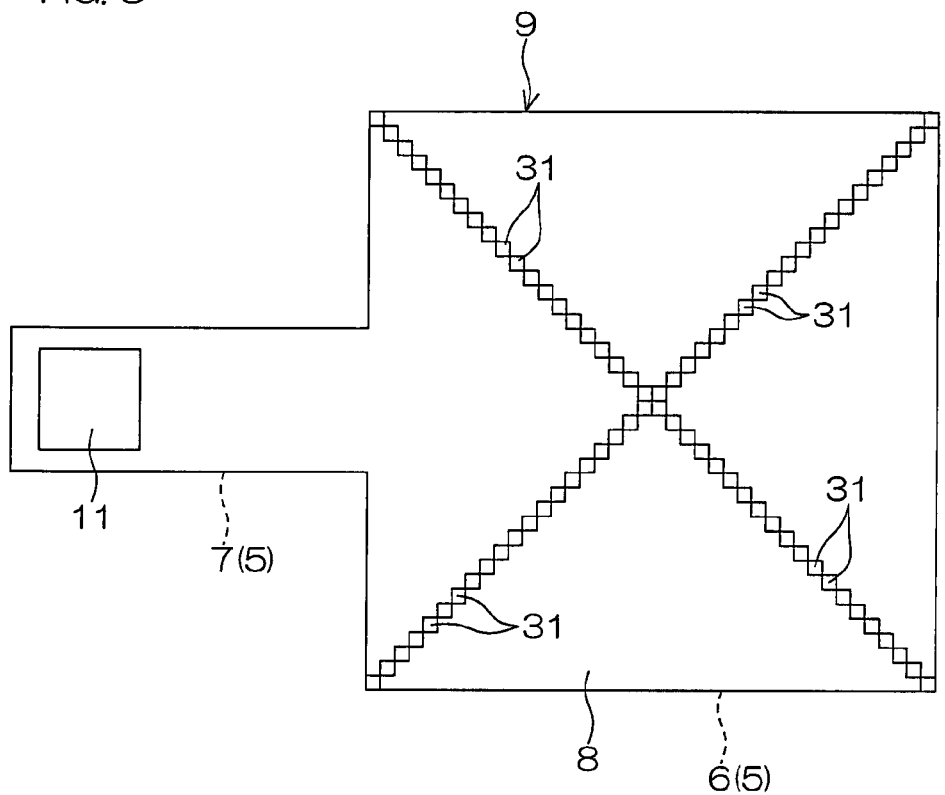
FIG. 3 is a schematic plan view showing another structure of an oscillation film.
Figure 4:
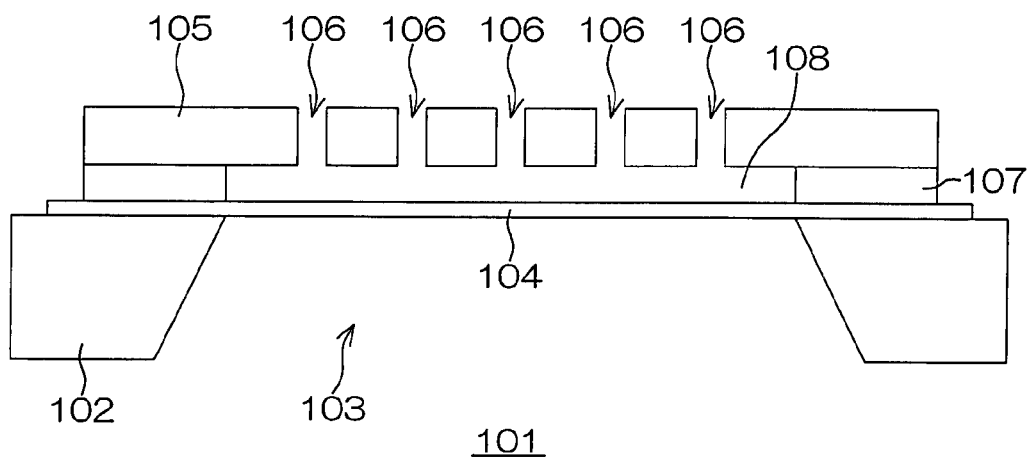
FIG. 4 is a schematic sectional view showing the structure of a traditional Si microphone.

After forming the first insulation layer 8 so as to cover the surface, side surfaces and lower surface of the first metal layer 5 without forming the polysilicon sacrificing layer 22, a number of holes 31 are formed in the oscillation film 9 comprising the first metal layer 5 and the first insulation layer 8 as shown in FIG. 3, and after removing the metal sacrificing layer 23, a silicon etching solution may be supplied to the silicon substrate 2 via a number of the holes 31. In this case, by using the same type of etching solution for the silicon etching solution and the metal etching solution, in other words, by using an etching solution capable of etching both metal which forms the metal sacrificing layer 23, and silicon, removal of the metal sacrificing layer 23 and etching of the silicon substrate 2 can be carried out in the same process. As a result, the number of steps for manufacturing the Si microphones 1 can be reduced. In order to prevent the first metal layer 5 from being etched by an etching solution, the inner surface of each hole 31 is covered by the first insulation layer 8.

As shown in FIG. 3, a number of the holes 31 may be arrayed in a shape of X in plan view. The shape is not limited thereto, and the holes 31 may be arrayed to be rectangular in plan view.

In the Si microphone 1, since the second metal layer 12 is formed of gold, by exposing a part of the second metal layer 12, the part can be a bonding pad to which a bonding wire such as a gold thin wire can be satisfactorily connected. For this reason, a film to secure favorable connection between the second metal layer 12 and a bonding wire can be omitted, whereby the structure can be simplified.

A detailed description has been given of embodiments of the present invention. However, these embodiments are only specific examples used to make apparent the technical features of the present invention, and the present invention should not be interpreted as being limited to these specific examples, and the spirit and the scope of the present invention are limited only by the scope of the appended claims.

For example, although the through-hole 3 whose section is trapezoidal is formed in the silicon substrate in the above embodiments, a recess which is indented from the surface of the silicon substrate 2 toward the rear side, whose section is trapezoidal, and whose dimension (width in the direction parallel to the surface of the silicon substrate 2) becomes smaller toward the rear side thereof may be formed instead of the through-hole 3.

Further, even though an Si microphone 1 is taken as an example of a capacitance sensor, the capacitance sensor is not limited thereto. The present invention may be applicable to a pressure sensor and an acceleration sensor which operate by detecting the amount of change in electrostatic capacitance.

The present application corresponds to Japanese Patent Application No. 2006-278788 filed with the Japan Patent Office on Oct. 12, 2006, and all the disclosures thereof are incorporated herein by references.

What is claimed is:

1. A capacitance sensor comprising:
   a silicon substrate having a hole or a recess whose dimension becomes smaller toward a rear side thereof and whose section is trapezoidal;
   a first metal layer that is provided on a surface of the silicon substrate and is opposed to the hole or the recess;
   a first insulation layer formed on the first metal layer;
   a second insulation layer opposed to the first insulation layer with predetermined spacing;
   a second metal layer provided with an upper surface and one or more side surfaces thereof, and formed on the second insulation layer, wherein the second metal layer includes a portion directly facing the first metal layer and a portion directly facing the hole or the recess, and faces an edge of the first metal layer above the hole or the recess, and
   a surface protection film configured to cover the upper surface and the side surfaces of the second metal layer, wherein
   the portion of the second metal layer directly facing the hole or recess is lower than the portion thereof directly facing the first metal layer, and
   the second metal layer has a step between the portion of the second metal layer directly facing the hole or recess and the portion thereof directly facing the first metal layer.

2. The capacitance sensor according to claim 1, wherein a cavity between the first insulation layer and the second insulation layer communicates with the hole or the recess.

3. The capacitance sensor according to claim 1, wherein the second metal layer is formed of gold.

4. The capacitance sensor according to claim 1, wherein the first insulation layer is made of silicon oxide to which p-type impurities are doped.

5. The capacitance sensor according to claim 1, wherein the second insulation layer is made of silicon oxide to which p-type impurities are doped.

6. The capacitance sensor according to claim 1, wherein
   the first metal layer and the first insulation layer form an oscillation film; and
   a plurality of holes are formed in the oscillation film.

7. A capacitance sensor comprising:
   a silicon substrate having a hole or a recess;
   a first metal layer that is provided on a surface of the silicon substrate and is opposed to the hole or the recess;
   a first insulation layer formed on the first metal layer;
   a second insulation layer opposed to the first insulation layer with predetermined spacing; and
   a second metal layer formed on the second insulation layer, wherein the second metal layer includes a portion directly facing the first metal layer and a portion directly facing the hole or the recess, and faces an edge of the first metal layer above the hole or the recess, wherein
   the portion of the second metal layer directly facing the hole or recess is lower than the portion thereof directly facing the first metal layer, and
   the second metal layer has a step between the portion of the second metal layer directly facing the hole or recess and the portion thereof directly facing the first metal layer.

8. The capacitance sensor according to claim 7, wherein
   the second metal layer is provided with an upper surface and one or more side surfaces thereof, and
   the capacitance sensor further comprises a surface protection film configured to cover the upper surface and the side surfaces of the second metal layer.

9. The capacitance sensor according to claim 7, wherein the hole or the recess has a dimension that becomes smaller toward a rear side of the silicon substrate, and a trapezoidal section.

10. The capacitance sensor according to claim 7, wherein a cavity between the first insulation layer and the second insulation layer communicates with the hole or the recess.

11. The capacitance sensor according to claim 7, wherein the second metal layer is formed of gold.

12. The capacitance sensor according to claim 7, wherein the first insulation layer is made of silicon oxide to which p-type impurities are doped.

13. The capacitance sensor according to claim 7, wherein the second insulation layer is made of silicon oxide to which p-type impurities are doped.

14. The capacitance sensor according to claim 7, wherein the first metal layer and the first insulation layer form an oscillation film, and a plurality of holes are formed in the oscillation film.

* * * * *